United States Patent
Bencher (10) Patent No.: US 9,383,649 B2
(45) Date of Patent: Jul. 5, 2016

(54) DIGITAL GREY TONE LITHOGRAPHY FOR 3D PATTERN FORMATION

(71) Applicant: Applied Materials, Inc., Santa Clara, CA (US)

(72) Inventor: Christopher Dennis Bencher, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/802,906

(22) Filed: Jul. 17, 2015

(65) Prior Publication Data

US 2016/0033867 A1 Feb. 4, 2016

Related U.S. Application Data (60) Provisional application No. 62/094,044, filed on Dec. 18, 2014, provisional application No. 62/032,491, filed on Aug. 1, 2014.

(51) Int. Cl.
*G03F 7/20* (2006.01)
*G03F 7/00* (2006.01)

(52) U.S. Cl.
CPC .............. *G03F 7/203* (2013.01); *G03F 7/0037* (2013.01)

(58) Field of Classification Search
CPC ............................... G03F 7/203; G03F 7/0037
USPC .................. 430/30, 296, 394, 942; 250/492.2
See application file for complete search history.

(56) References Cited

U.S. PATENT DOCUMENTS

| 6,238,852 | B1 | 5/2001 | Klosner |
| 2009/0086176 | A1 | 4/2009 | Meisburger |
| 2014/0176929 | A1 | 6/2014 | Troost et al. |
| 2014/0192334 | A1 | 7/2014 | Chen et al. |

FOREIGN PATENT DOCUMENTS

JP 2003-173949 A 6/2003

OTHER PUBLICATIONS

International Search Report and Written Opinion for PCT/US2015040121. Dated Oct. 30, 2015.

*Primary Examiner* — Christopher Young
(74) *Attorney, Agent, or Firm* — Patterson & Sheridan, LLP (57) ABSTRACT

A method of processing a substrate is described herein. The method includes positioning a substrate on a stage associated with a maskless direct writing pattern generator. The substrate has an undeveloped, unexposed photoresist layer formed thereon. The photoresist layer has a plurality of writing pixel locations. The method includes delivering predetermined doses of electromagnetic energy from the pattern generator to each writing pixel location. A first predetermined dose is a full tone dose, and the first predetermined dose is delivered to at least one writing pixel location. A second predetermined is a fractional tone dose, and the second predetermined dose is delivered to at least one writing pixel location. A third predetermined dose is either a fractional dose or a zero tone dose. The third predetermined dose is delivered to at least one writing pixel location, and the third predetermined dose is different from the second predetermined dose.

13 Claims, 8 Drawing Sheets

DIGITAL GREY TONE LITHOGRAPHY FOR 3D PATTERN FORMATION

CROSS-REFERENCE TO RELATED APPLICATIONS

This application claims benefit of U.S. Provisional Patent Application Ser. No. 62/032,491, filed Aug. 1, 2014 and U.S. Provisional Patent Application Ser. No. 62/094,044, filed Dec. 18, 2014, which is herein incorporated by reference.

BACKGROUND

1. Field

Embodiments of the present disclosure generally relate to apparatuses and methods for microlithography patterning and more particularly to microlithography patterning for large substrates with a photoresist film applied.

2. Description of the Related Art

Large area substrates are often utilized to support electrical features used in electronic devices. In some cases, large area substrates are used when manufacturing flat panels for active matrix displays such as computers, touch panel devices, personal digital assistances (PDAs), cell phones, television monitors, and the like. Generally, flat panels may comprise a layer of liquid crystal material forming pixels sandwiched between two plates. When power from the power supply is applied across the liquid crystal material during use, an amount of light passing through the liquid crystal material may be precisely controlled at pixel locations enabling images to be generated.

In some cases, microlithography techniques are employed to create electrical features incorporated as part of the liquid crystal material layer forming the pixels. According to this technique, a radiation-sensitive photoresist is applied to form a layer on a substrate surface with either a track or coater system to produce typically a sub-millimeter thickness of photoresist upon at least one surface of the substrate.

Demand continues to increase for less expensive, larger, and higher performance electronic devices. Larger substrates with smaller and more uniform features are required to satisfy the demand for these electronic devices. However, current approaches can be costly and time-consuming. Accordingly, new approaches are needed to more precisely create smaller and more uniform patterns on large substrates.

SUMMARY

Embodiments disclosed herein include directing writing beams to writing pixel locations disposed upon an unexposed, undeveloped photoresist layer to vary the thickness of the developed photoresist layer at different predetermined locations. Embodiments disclosed herein allow for simplified substrate processing.

Embodiments disclosed herein include a method of processing a substrate. The method includes positioning a substrate on a stage associated with a maskless direct writing pattern generator. The substrate has an undeveloped, unexposed photoresist layer formed thereon. The photoresist layer has a plurality of writing pixel locations. The method also includes delivering predetermined doses of electromagnetic energy from the pattern generator to each writing pixel location of the photoresist layer. A first predetermined total dose is a full tone dose, and the first predetermined dose is delivered to a first set of writing pixel locations. A second predetermined total dose is a fractional tone dose, and the second predetermined dose is delivered to a second set of writing pixel locations. A third predetermined total dose is either a fractional dose or a zero tone dose. The third predetermined dose is delivered to a third set of writing pixel locations, and the third predetermined dose is different from the second predetermined dose. The full tone dose, the fractional tone dose and the zero tone dose may be delivered in parallel (i.e., substantially simultaneously).

Embodiments disclosed herein include a method of processing a substrate. The method includes positioning a substrate on a stage associated with a maskless direct writing pattern generator. The substrate has an undeveloped, unexposed photoresist layer formed thereon. The photoresist layer has a plurality of writing pixel locations. The method also includes delivering predetermined doses of electromagnetic energy from the pattern generator to each writing pixel location of the photoresist layer. A first predetermined total dose is a full tone dose, and the first predetermined dose is delivered to a first set of writing pixel locations. A second predetermined total dose is a fractional tone dose, and the second predetermined dose is delivered to a second set of writing pixel locations. A third predetermined total dose is either a fractional dose or a zero tone dose. The third predetermined dose is delivered to a third set of writing pixel locations, and the third predetermined dose is different from the second predetermined dose. The fractional tone dose may be varied across the substrate to compensate for manufacturing non-uniformities. For some parts, the fractional dose may be adjusted based on a feedback control loop that adjusts the mean or the distribution of the fractional tone dose across the substrate.

Embodiments disclosed herein also include a pattern generator. The pattern generator includes a stage configured to support a substrate in a plurality of writing cycle zone locations during respective ones of a plurality of writing cycles. The pattern generator also includes a writing beam actuator configured to independently direct each of a plurality of writing beams to writing pixel locations disposed upon a photoresist of a substrate. The pattern generator also includes a computer processor configured to adjust the delivered writing dose for the respective writing pixel locations according to tone dose data at the respective writing pixel locations.

BRIEF DESCRIPTION OF THE DRAWINGS

So that the manner in which the above recited features of embodiments of the present disclosure can be understood in detail, a more particular description of embodiments of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for embodiments of the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Device designers may desire to control etching a layer or a substrate to different depths at different predetermined locations on the layer or substrate. In other words, device designers may seek to form a three-dimensional pattern in a substrate and/or one or more layers formed on the substrate. For example, a device designer may want to form a trench of a first depth in a dielectric layer above a metal line. The designer may also want to form a via or contact in the trench to form a connection with the metal line. Embodiments disclosed herein provide a highly tunable and cost-effective method of precisely controlling the etching depths at different locations on a substrate. More specifically, embodiments disclosed herein provide a maskless lithography technique wherein a pattern generator exposes different locations of a photoresist layer to different exposure doses. The exposure dose at each location may be predetermined to form a desired three dimensional pattern in the photoresist layer. The controlled and varied doses of the photoresist layer allow for the etching of the desired three-dimensional pattern into a substrate and/or one or more layers on the substrate.

As used herein, the term "tone dose" refers to the dose of electromagnetic radiation to be delivered to a specific writing pixel location. The tone dose may be a full tone dose, a fractional tone dose, a half tone dose, or a zero tone dose. As used herein the term "full tone dose" refers to a dose of electromagnetic radiation sufficient to clear about 100% of the photoresist layer after developing the photoresist layer. As used herein the term "half tone dose" refers to a dose of electromagnetic radiation configured to clear about 50% of the photoresist layer after developing the photoresist layer. As used herein the term "fractional tone dose" refers to a dose of electromagnetic radiation configured to clear less than about 100% but more than about 0% of the photoresist layer after developing the photoresist layer. A half tone dose is one type of fractional tone dose. As used herein the term "zero tone dose" refers to a dose of electromagnetic radiation sufficient to clear about 0% of the photoresist layer after developing the photoresist layer.

Figure 1:
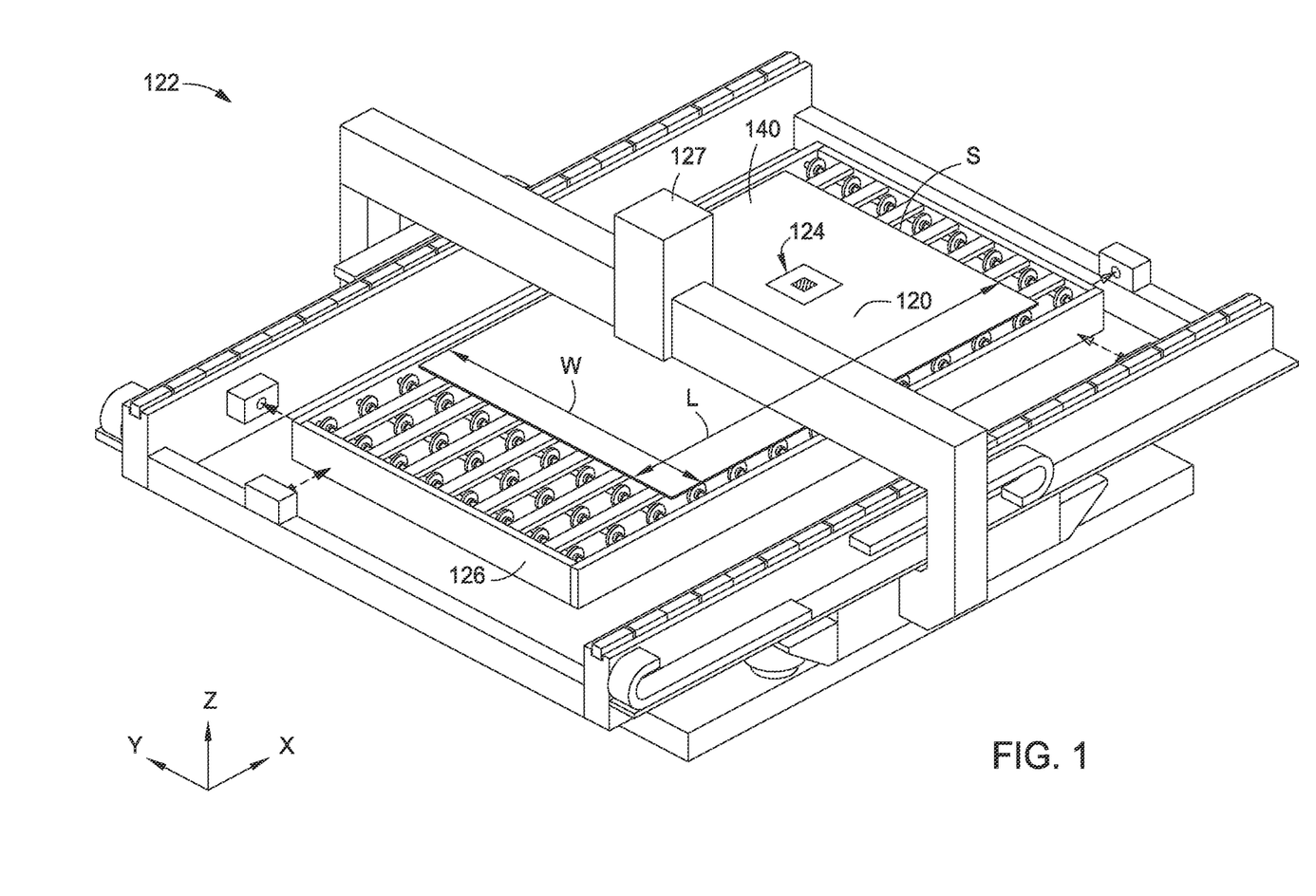
FIG. 1 is a top perspective view of a representative embodiment of a pattern generator, according to one embodiment.

FIG. 1 is a top perspective view of a representative embodiment of a pattern generator 122 that may be used to carry out embodiments disclosed herein. The pattern generator 122 may be a multi-beam pattern generator. As shown, the pattern generator 122 is a maskless pattern generator. Embodiments disclosed herein may also be performed by other pattern generators. As shown, a writing mechanism 127 is mounted relative a stage 126. The writing mechanism 127 may include a light source 228A, 228B, a writing beam actuator 230, a computer processor 232, and an optical device 234 (shown in FIG. 2). A substrate S may be supported by the stage 126. The substrate S may have a photoresist layer 140 formed thereon. For example, the photoresist layer 140 may be the outermost layer on the substrate S. The photoresist layer 140 may be an undeveloped photoresist layer. The stage 126 may move the substrate S relative to the writing mechanism 127 to form a pattern 124 on the photoresist layer 140.

In some embodiments, the substrate S may comprise quartz. In other embodiments, the substrate S may comprise glass. A quartz substrate S may be used, for example, as part of a flat panel display. The substrate S may include a first surface 120 having rectangular shape. The rectangular shape may have a length L of at least 2.4 meters and a width W of at least 2.1 meters. In this manner, the first surface 120 of the substrate S may support a pattern 124 having dimensional features associated with electronic circuitry.

The pattern 124 may be formed by writing the pattern 124 in the photoresist layer 140, such as with the writing mechanism 127. The photoresist layer 140 is sensitive to radiation and may be a positive photoresist or a negative photoresist, meaning that portions of the photoresist layer 140 exposed to radiation will be respectively soluble or insoluble to photoresist developer applied to the photoresist layer 140 after the pattern 124 is written into the photoresist layer 140. The chemical composition of the photoresist layer 140 determines whether the photoresist layer 140 will be a positive photoresist or negative photoresist. For example, the photoresist layer 140 may include at least one of diazonaphthoquinone, a phenol formaldehyde resin, poly(methyl methacrylate), poly(methyl glutarimide), and SU-8. In this manner, the pattern 124 may be created on the first surface 120 of the substrate S to form the electronic circuitry. The photoresist layer 140 may have a thickness, for example, between about 20 nanometers (nm) and about 2 to microns (μm). In other embodiments, the thickness may be less than about 20 nm or greater than about 2 μm.

Figure 2:
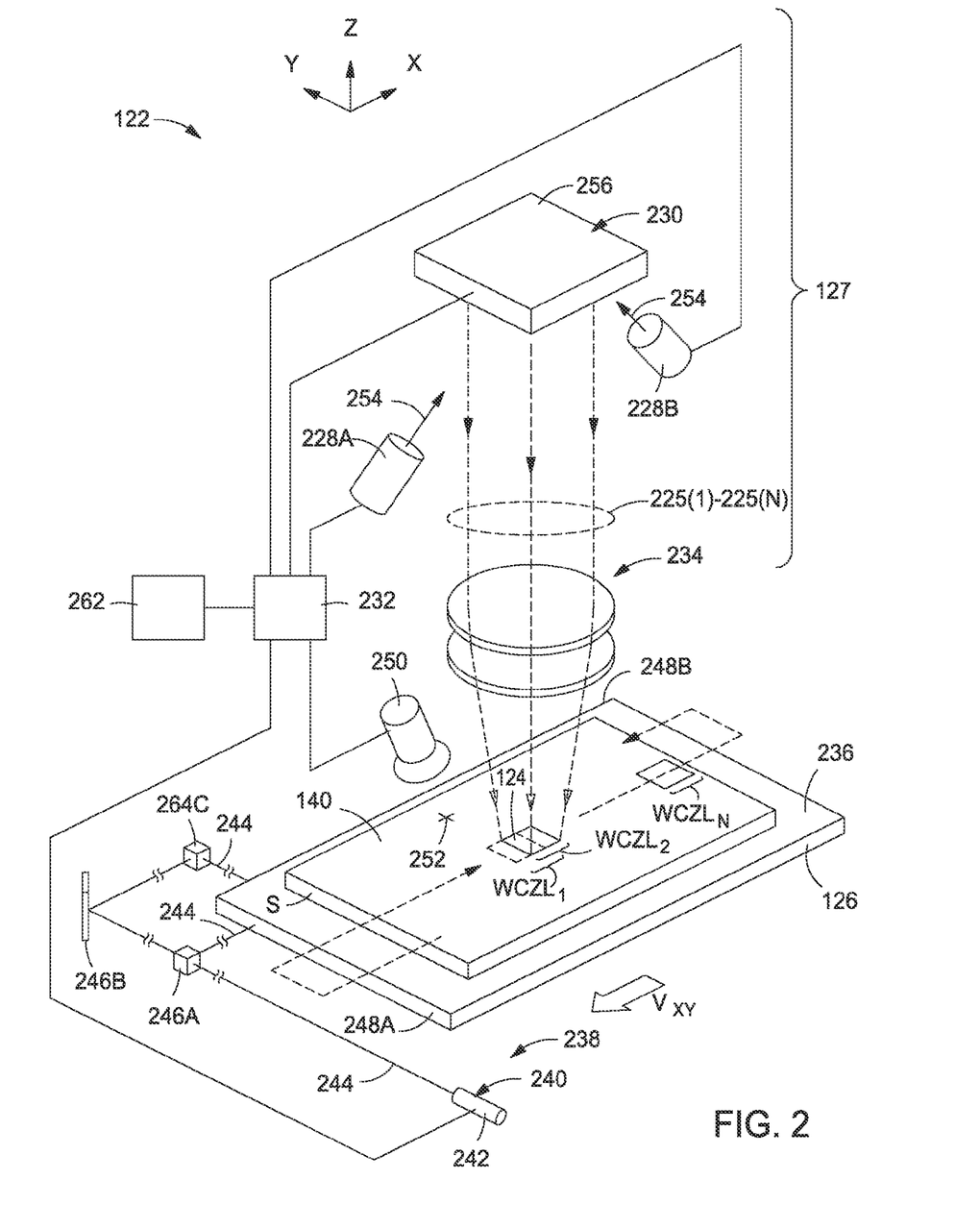
FIG. 2 is a top perspective schematic view of the pattern generator of FIG. 1, according to one embodiment.

FIG. 2 is a top perspective schematic view of a representative writing mechanism 127 of the pattern generator 122, according to one embodiment. The pattern generator 122 includes the stage 126 and the writing mechanism 127. The stage 126 may include at least one support surface 236 to support the substrate S in the z-direction. The stage 126 may move with the velocity $V_{XY}$ in the x-direction and/or the y-direction to provide movement between the substrate S and a writing beam actuator 230. The movement allows portions of the pattern 124 to be written by writing beams 225(1)-225 (N) during at least one writing cycle WC. The portions of the pattern 124 written in the writing cycles $WC_1$, $WC_2$, ... $WC_N$ are shown as $WCZL_1$, $WCZL_2$, ... $WCZL_N$, respectively. Each of the writing cycle $WC_1$, $WC_2$, ... $WC_N$ may be written in a speed of at least 15 kilohertz (KHz). The path of the stage 126 may be, for example, a serpentine shape to completely write the pattern 124 in the photoresist layer 140. The stage 126 may also include an electric motor (not shown) to provide movement. In this way, the substrate S may be positioned during writing of the pattern 124.

The stage 126 also may include a location device 238 to determine a location of the stage 126 and the substrate S during writing. In one embodiment, the location device 238 may comprise an interferometer 240. The interferometer 240 may include a laser 242 to emit a laser beam 244 directed by optical components 246A, 246B, 246C to adjacent sides 248A, 248B of the stage 126. Data from the location device 238 regarding changes in the position of the stage 126 in the x-direction and/or y-direction may be provided to the computer processor 232.

To ensure that the location of the substrate S may be established relative to the stage 126, the location device 238 may also include an alignment camera 250. The alignment camera 250 may include an optical sensor, for example a charge coupling device, to read at least one alignment mark 252 on the substrate S to register the substrate S to the stage 126 and the writing beam actuator 230. The alignment camera 250 may be coupled to the computer processor 232 to facilitate the determination of the pattern 124 upon the substrate S. In this regard, once the substrate S may be registered via the alignment camera 250, the position of the substrate S with regards to the stage 126 may be determined.

The pattern generator 122 includes the light source 228A, 228B. In the embodiment shown in FIG. 2, the light source 228A, 228B comprises at least one laser that emits light 254 towards the writing beam actuator 230. The light source 228A, 228B may be configured to emit light 254 with one or more wavelengths consistent with the use of the photoresist layer 140. For example, the wavelength may be less than or equal to 405 nm. In this manner, the writing beam actuator 230 may be supplied with electromagnetic energy to be directed as the writing beams 225(1)-225(N) to writing pixel locations WPL (discussed later relative to FIGS. 5A and 5B) on the photoresist layer 140.

Figure 3:
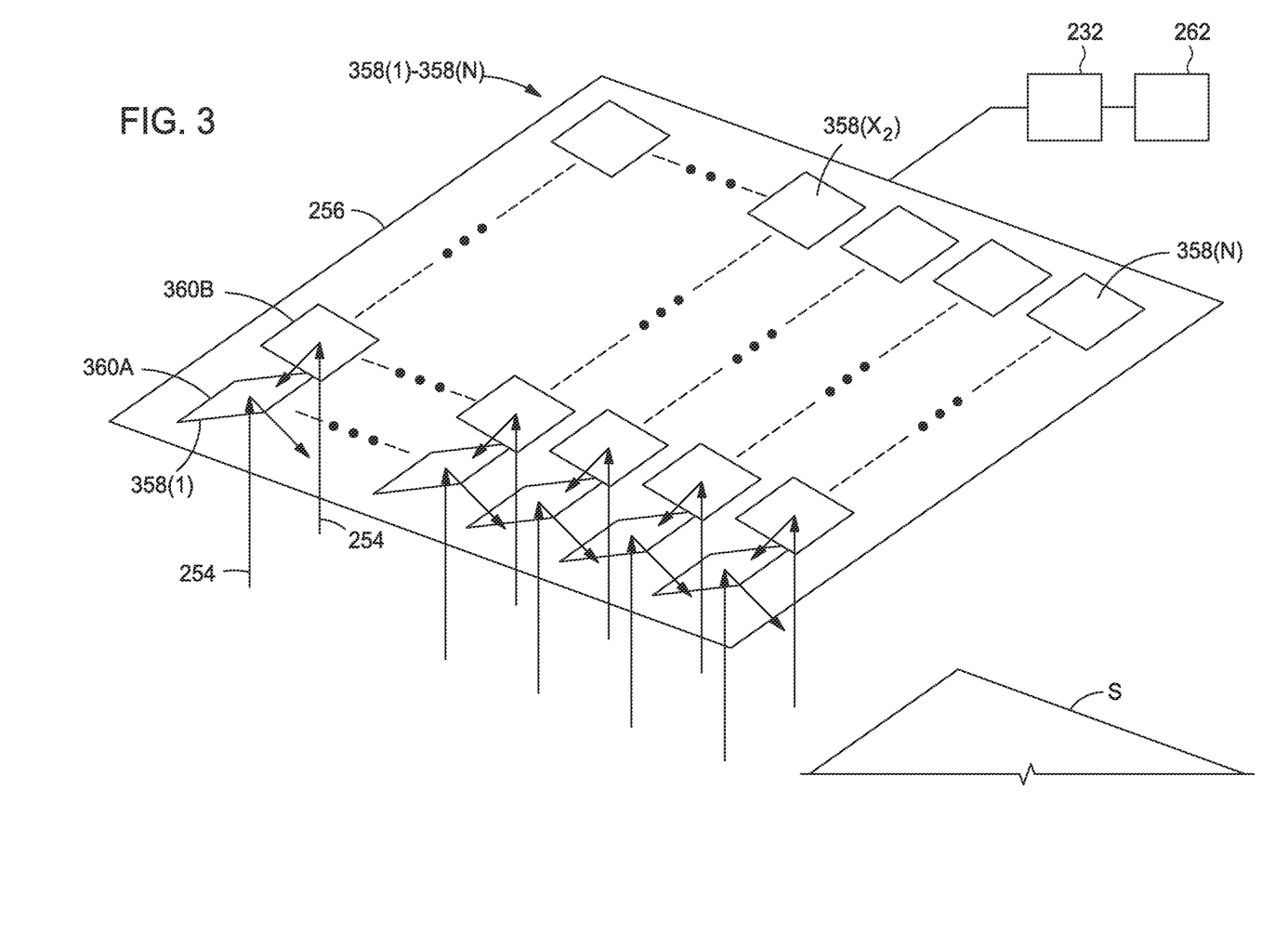
FIG. 3 is a top perspective schematic view of an embodiment of the writing beam mechanism of FIG. 2 including a spatial light modulator, according to one embodiment.

The writing beam actuator 230 may be, for example, a spatial light modulator 256 (SLM). The SLM 256 comprises mirrors 358(1)-358(N) (FIG. 3). The mirrors 358(1)-358(N) may be individually controlled by signals from the computer processor 232. The SLM 256 may be, for example, a DLP9500-type digital mirror device made by Texas Instruments Incorporated of Dallas, Tex. The mirrors 358(1)-358(N) may be, for example, arranged in 1920 columns and 1080 rows. In this manner, light 254 may be deflected by the mirrors 358(1)-358(N) to the photoresist layer 140.

FIG. 3 is a top perspective schematic view of an embodiment of the writing beam mechanism 127, according to one embodiment. Each of the mirrors 358(1)-358(N) of the SLM 256 may be configured to be individually actuateable (or digitally controlled) from the respective inactive position 360B to the respective active position 360A in order to reflect a respective portion of light 254 to the substrate S. Each of the mirrors 358(1)-358(N) may reflect a portion of light 254 to the substrate S while in the active position 360A, and less than 5 percent of this reflected portion to the substrate S when in the inactive position 360B. The energy of light 254 may be deposited across the pattern 124 in various ones of the writing cycle zone locations $WCZL_1$-$WCZL_N$. The writing cycle zone locations $WCZL_1$-$WCZL_N$ may overlap, as depicted in FIG. 2. In this manner, features of the pattern 124 may be determined from multiple writing cycles WC to reduce positional error as the electromagnetic energy delivered in any single writing cycle WC to the substrate S is averaged with the electromagnetic energy delivered in other writing cycles WC to form the pattern 124.

The pattern generator 122 also includes the computer processor 232. The computer processor 232 may determine the total tone dose at each writing pixel location $WPL_1$-$WPL_N$ from location data received from the location device 238 and from tone dose data. The total tone dose at each writing pixel location $WPL_1$-$WPL_N$ may be delivered over one or more writing cycles WC. The computer processor 232 may then direct the light 254 to the substrate S. For example, the computer processor 232 may determine whether various ones of the mirrors 358(1)-358(N) are to be actuated to the active position 360A based upon whether the writing pixel locations $WPL_1$-$WPL_N$ of each of the respective writing beams 225(1)-225(N) are disposed within a pattern feature 524, 524' (FIGS. 5A and 5B) of the pattern 124. The computer processor 232 may determine the dwell time for each of the mirrors 358(1)-358(N) based on the tone dose data. The tone dose data may be based on the predetermined thickness of the developed photoresist layer 140 at a respective writing pixel location WPL. The tone dose data may also include a compensation factor to compensate for processing non-uniformities (discussed below) at one or more writing pixel locations WPL. The computer processor 232 may convert the respective tone dose data to dwell times (or laser pulse power, or more/less mirror actuations (shots)) according to, for example, a linear relationship. In this manner, the computer processor 232 may adjust the tone dose for respective writing pixel positions $WPL_1$-$WPL_N$ according to the predetermined thickness of the developed photoresist layer 140 at the different writing pixel locations $WPL_1$-$WPL_N$.

The computer processor 232 may determine the respective tone doses associated with the respective writing pixel locations $WPL_1$-$WPL_N$ by accessing the tone dose data. The tone dose data may be located, for example, in the storage device 262. As noted above, the tone dose data may include the predetermined thickness of the developed photoresist layer 140 at a respective writing pixel location WPL and a compensation factor. The tone dose data may include, for example, look-up tables. The compensation factor may compensate for non-uniformities and may be in the form of a dose correction map. The non-uniformities may relate to variations in the processing rates, such as etching rates, at different writing pixel locations $WPL_1$-$WPL_N$ on the substrate S. The non-uniformities may alternatively or additionally relate to non-uniformities associated with the processing track to be used or other factors. Information regarding the non-uniformities may be experimentally or theoretically determined and then made accessible by the computer processor 232.

Figure 4A:
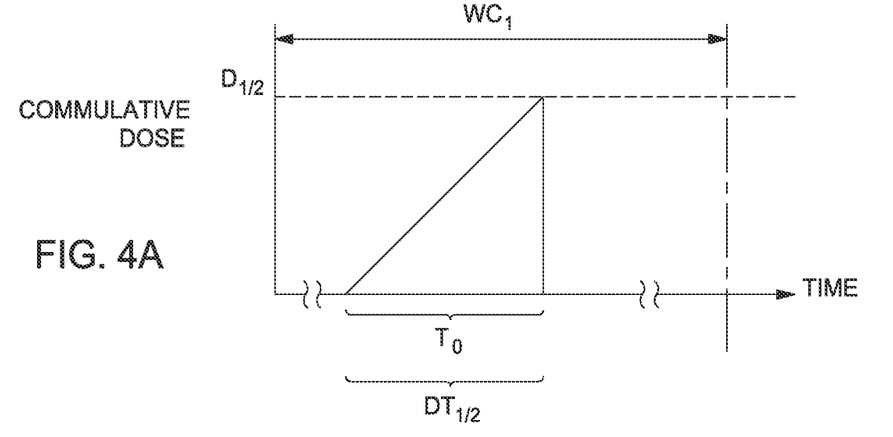
FIGS. 4A and 4B are graphical representations of exposure dose versus dwell time, according to one embodiment.
Figure 4B:
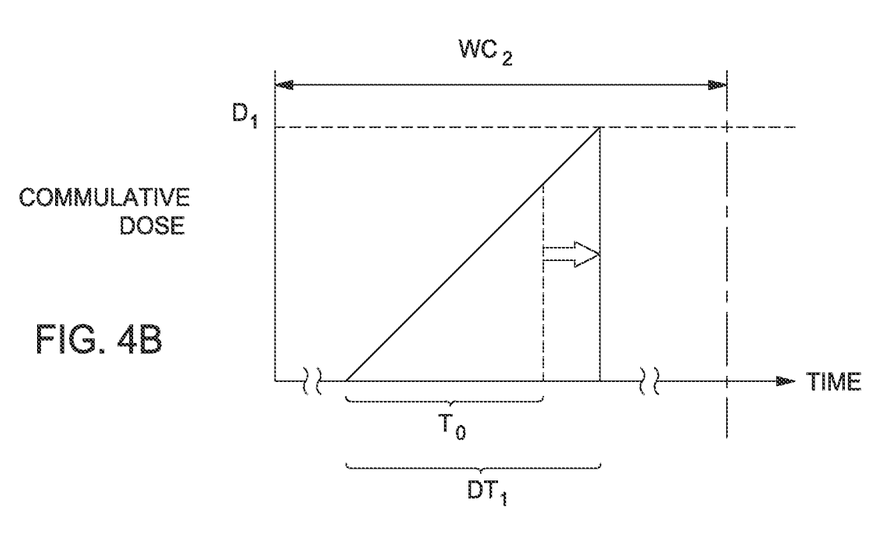
Figure 5A:
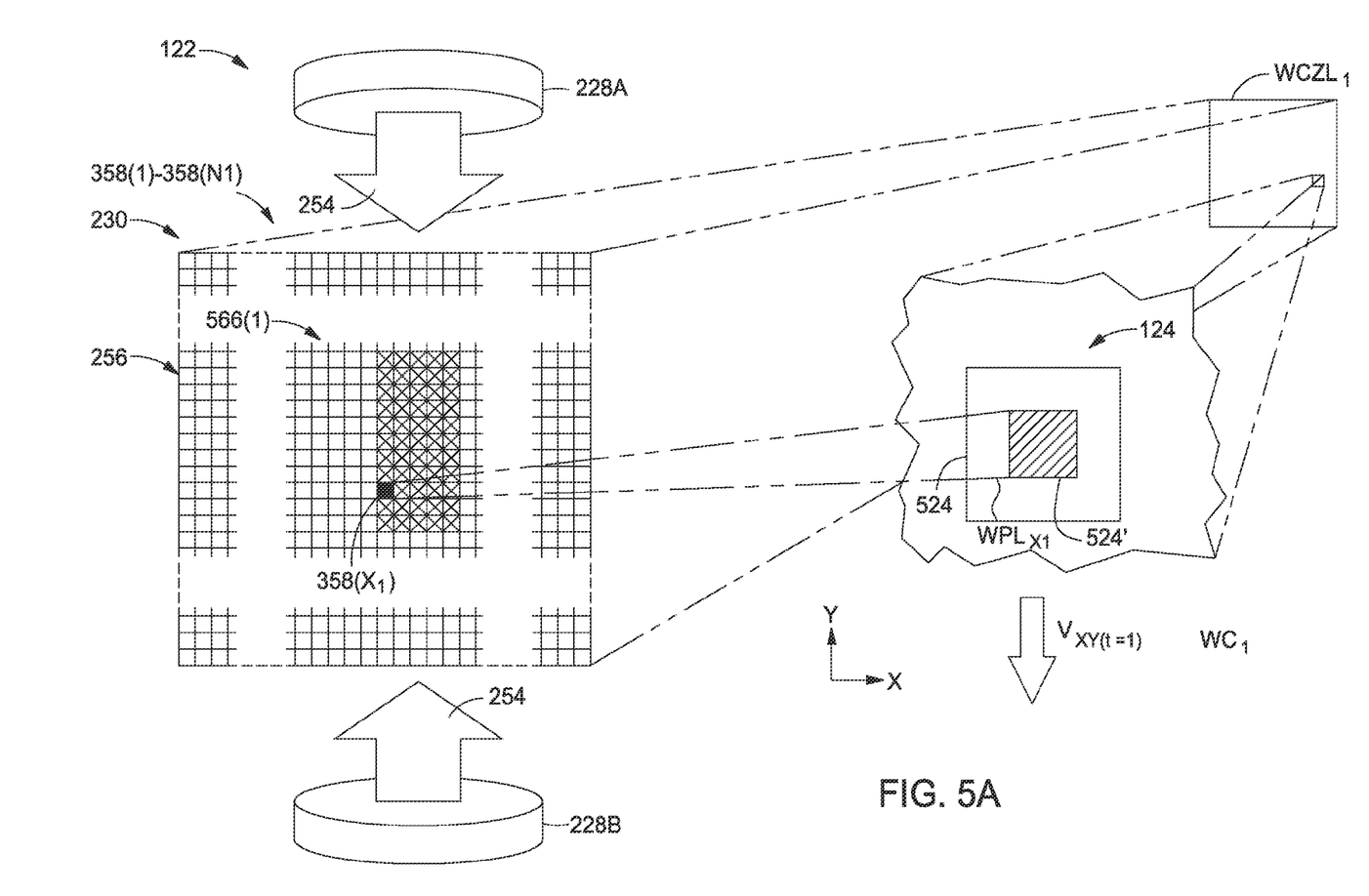
FIGS. 5A and 5B are top perspective schematic views of the writing mechanism of FIG. 2 writing representative pattern features of a pattern using different dwell times, according to one embodiment.
Figure 5B:
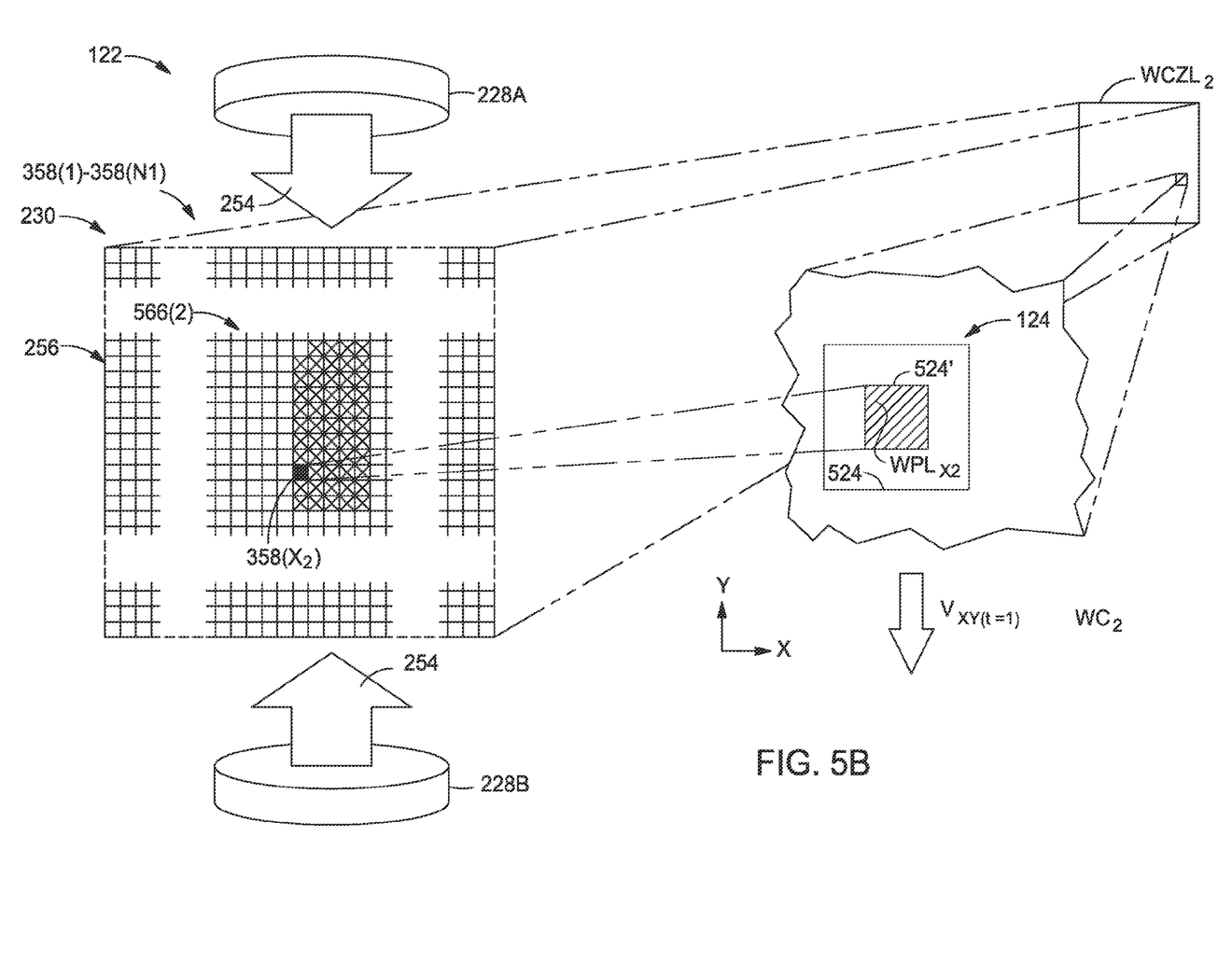

FIGS. 4A and 4B will be discussed in conjunction with FIGS. 5A and 5B, respectively. FIGS. 4A and 4B provide examples of adjusting dwell time from a half-tone dose to a full-tone dose, respectively. More specifically, FIGS. 4A and 4B are graphs of cumulative dose of a writing beam upon a writing pixel location $WPL_{X1}$ and $WPL_{X2}$, respectively, during the writing cycles $WC_1$ and $WC_2$, respectively. FIGS. 5A and 5B are top perspective schematic views of mirrors 358(1)-358(N) of the SLM 256 of FIG. 2 writing representative pattern features of the pattern 124 with a dwell time adjustment. As shown in FIGS. 5A and 5B, the pattern 124 includes a pattern feature 524 and a pattern feature 524'. Also as shown, the pattern feature 524' is bounded within the pattern feature 524.

In FIGS. 4A and 5A, a half-tone dose $D_{1/2}$ of radiation is delivered to a writing pixel location $WPL_{X1}$ within the pattern feature 524. The writing beams 225(1)-225(N1) may be formed by reflecting with actuated ones of the mirrors 358(1)-358(N1) the light 254 from the light sources 228A, 228B into the first writing cycle zone location $WCZL_1$ in the photoresist layer 140. The writing pixel location $WPL_{X1}$ of the pattern feature 524 may be associated with mirror 358($X_1$). A portion 566(1) of the mirrors 358(1)-358(N) may be used to form writing beams to write various locations around writing pixel location $WPL_{X1}$. FIG. 4A depicts the dwell time $DT_{1/2}$ required for the mirror 358($X_1$) in the actuated position 360A to deliver the cumulative dose $D_{1/2}$ to the respective writing location $WPL_{X1}$. The dwell time $DT_{1/2}$ may be in a range, for example, from about 0 to about 100 μs. The computer processor 232 may instruct the mirror 358($X_1$) to be in the actuated position 360A for a dwell time $DT_{1/2}$ during the writing cycle $WC_1$. In this manner, the pattern feature 524 may be written with precise control.

In contrast to FIGS. 4A and 5A, FIGS. 4B and 5B are associated with a full-tone dose to a writing pixel location $WPL_{X2}$ within the pattern feature 524'. Here, a dose $D_1$ associated with delivering radiation energy to the writing pixel location $WPL_{X2}$ is shown. The writing beams may be formed by reflecting with actuated ones of the mirrors 358(1)-358(N) the light 254 from the light sources 228A, 228B into the photoresist layer 140. The writing pixel location $WPL_{X2}$ may be associated with the mirror 358($X_2$) and a full-tone dose $D_1$. A portion 566(2) of the mirrors 358(1)-358(N) may be used to form writing beams to write various locations around the pattern feature 524'. FIG. 4B depicts the dwell time $DT_1$ required for the mirror 358($X_2$) to be in the actuated position 360A to deliver the dose $D_1$ to the respective writing location $WPL_{X2}$. The computer processor 232 may instruct the mirror 358($X_2$) to be in the actuated position 360A during the writing cycle $WC_2$. In this manner, the pattern feature 524' may be written with specified dimensions.

For example, if there are two writing cycles and $WPL_{X1}$ is to receive a ½ dose, then mirror 358($X_1$) will be actuated to an "on" position for one writing cycle and actuated to the "off" position for the other writing cycle. The "on" cycle may be chosen to be either the first or the second writing cycle so long as the cumulative dose delivered to $WPL_{X1}$ is a ½ dose. Expanding the concept to many dose cycles, it is contemplated that any dose amount between a full dose and zero dose may be achieved by simply actuating mirror 358($X_1$) to the "on" position. Once the writing cycle is complete over, the cumulative dose will be the desired dose amount. For a zero dose, the mirror 358($X_1$) will always be in the "off" position during each dose of the dose cycle. For a full dose, the mirror 358($X_1$) will always be in the "on" position during each dose of the dose cycle. For the fractional dose (i.e., not a full dose, but more than zero dose), the mirror 358($X_1$) may be in either the "on" or "off" position depending upon dose scheduling and desired cumulative dose. At any time during a dose cycle, any mirror in the "on" position will deliver the exact same dose amount regardless of whether a fractional or full dose is delivered. However, over the entire dose cycle, the cumulative dose delivered will be different between a fractional dose and a full dose.

Figure 6:
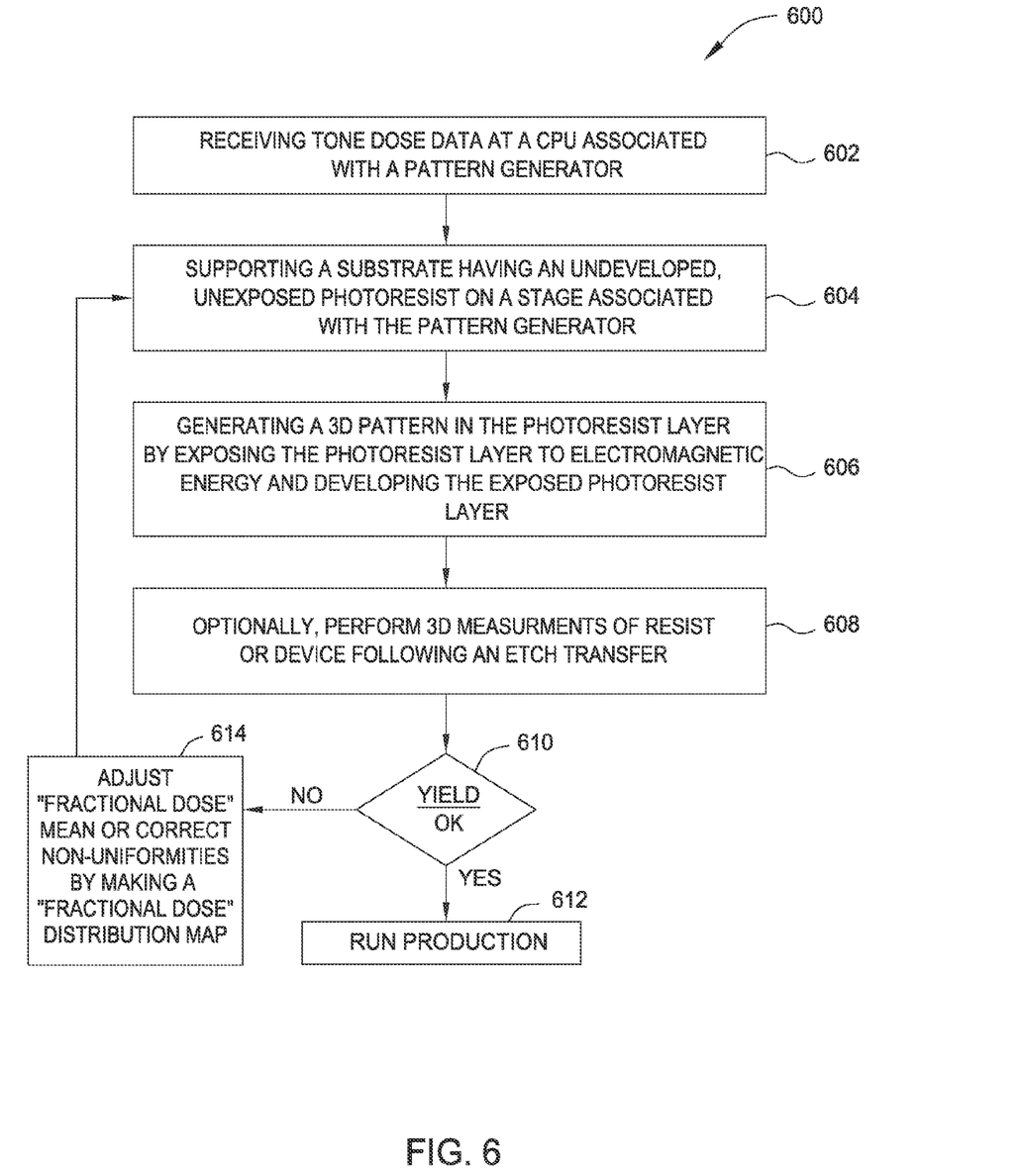
FIG. 6 is a flow chart of a representative process of writing a pattern upon a substrate with the pattern generator of FIG. 1, according to one embodiment.
Figure 7A:
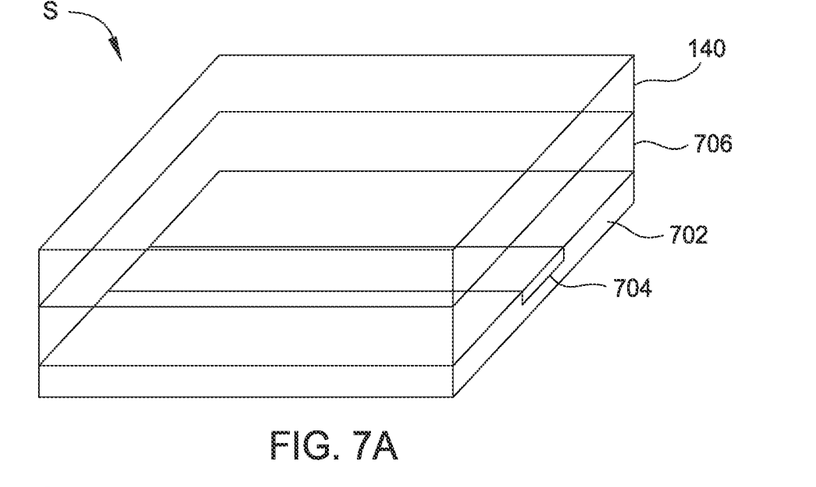
FIGS. 7A through 7C depict a substrate during various stages of the method of FIG. 6, according to one embodiment.
Figure 7B:
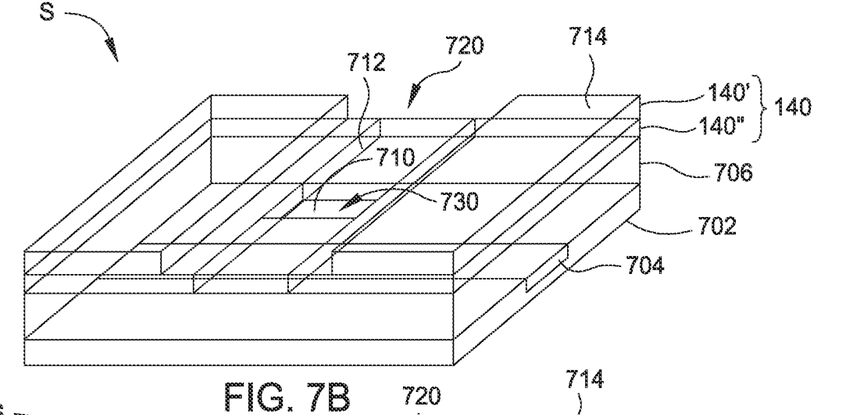
Figure 7C:
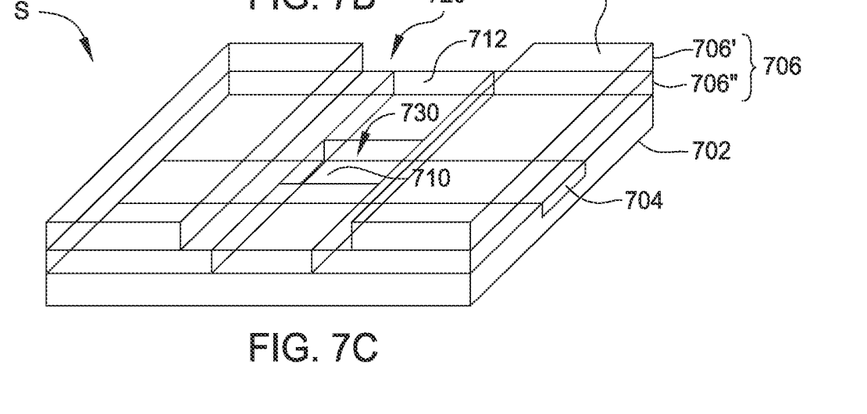

FIG. 6 depicts a flowchart diagram of a representative process 600 for using the pattern generator 122. The process 600 has multiple stages. The stages can be carried out in any order or simultaneously (except where the context excludes that possibility), and the method can include one or more other stages which are carried out before any of the defined stages, between two of the defined stages, or after all the defined stages (except where the context excludes that possibility). Not all embodiments include all the stages. The process 600 will be described in relation to FIG. 7. FIG. 7 depicts a substrate S during various stages of the process 600.

In stage 602, a computer processor associated with a pattern generator receives tone dose data. The pattern generator may be, for example, the pattern generator 122. The computer processor may be, for example, the computer processor 232. The tone dose data may be provided to the computer processor 232 by the memory device 262 or in any other suitable manner. The tone dose data may be as described above. In some embodiments, the dose at each writing pixel location WPL may be predetermined by a device designer to generate a predetermined 3D pattern in a photoresist layer. In some embodiments, the tone dose data alternatively or additionally includes corrections for processing non-uniformities, such as the non-uniformities discussed above. The substrate may be, for example, the substrate S described above.

At stage 604, the substrate S having an undeveloped, unexposed photoresist layer is supported on a stage associated with the pattern generator 122. The stage may be the stage 126 described above. In one embodiment, the substrate S may be as shown in FIG. 7A. As shown, the substrate S includes a first layer 702. In some embodiments, the first layer 702 may be a dielectric layer. As shown the substrate S has a metal line 704 formed therein. The metal line 704 is bounded on three sides by the first layer 702. In other embodiments, the first layer 702 may not have a metal line 704 formed therein. As shown, the substrate S includes a second layer 706 formed on top of the first layer 702 and the metal line 704. In some embodiments, the second layer 706 may be a dielectric layer. As shown, the substrate S includes a photoresist layer 140 on top of the second layer 706. The photoresist layer 140 is unexposed and undeveloped. The photoresist layer 140 may be as described above.

At stage 606, a three-dimensional pattern is generated in the photoresist layer 140 by exposing the photoresist layer 140. The pattern is generated by exposing the photoresist layer 140 to electromagnetic radiation according to the received tone dose data and thereafter developing the photoresist layer 140. The pattern generator 122 delivers the total predetermined dose indicated by the tone dose data to each writing pixel location WPL. The total predetermined dose may be delivered over one or more writing cycles WC. The dose of electromagnetic energy may be delivered to each writing pixel location WPL by the movement of the stage 126 and/or the angle of the mirrors 358(1)-358(N), as described above. The dose of electromagnetic energy delivered to some writing pixel locations WPL may be zero or approximately zero.

After exposing the substrate S to electromagnetic energy, the substrate S may be developed. In one embodiment, the substrate S may be as shown in FIG. 7B after development. The exposed, developed photoresist layer 140 has different thicknesses at the locations 714, 712, and 710, corresponding to locations that received a zero tone dose, a half tone dose, and a full tone dose, respectively. The different thicknesses of the photoresist layer 140 are illustrated by representing the photoresist layer 140 as having two components, the component 140' and the component 140". At the location 714, the photoresist layer 140 received a zero tone dose. The zero tone dose is represented by the photoresist layer 140 having a component 140' and a component 140". As shown, the component 140' and the component 140" have approximately equal thicknesses.

At the location 712, the photoresist layer 140 received a half tone dose. The half dose is indicated by the location 712 having a photoresist layer component 140" but not a photoresist layer component 140'. The location 712 is located within a trench 720. The half tone dose may have been delivered to the substrate S as indicated above in relation to FIGS. 4A and 5A.

At the location 710, the photoresist layer 140 received a full tone dose. The full tone dose is indicated by the location 710 having neither a photoresist layer component 140" nor a photoresist layer component 140'. The location 710 is located within a via 730. The full tone dose may have been delivered to the substrate S as indicated above in relation to FIGS. 4B and 5B.

As shown in FIG. 7B, each writing pixel location WPL had been exposed to a zero tone dose, a half tone dose, or a full tone dose. In other embodiments, the substrate S may have writing pixel locations WPL that have been exposed to fractional tone doses other than a half tone dose. For example, the fractional tone doses may be between about 45% and about 50% or between about 50% and about 55% of either a zero tone dose or a full tone dose. The reference point depends on whether the resist is a positive resist or a negative resist. If a positive resist is used, the reference point would be the full tone dose since the full tone dose would clear all the resist. If a negative resist is used, the reference point would be a zero tone dose since a zero tone dose would clear all the resist. Such fractional tone doses may allow for correcting processing non-uniformities, such as the processing non-uniformities described above. In other embodiments, the fractional tone doses may be less than about 45% or greater than about 55% of a full tone dose or a zero tone dose. The fractional tone dose may be varied across the substrate to compensate for manufacturing non-uniformities. For some parts, the fractional does may be adjusted based on feedback from a feedback control loop that adjusts the mean or the distribution across the substrate.

At optional stage 608, 3D measurements of the resist or device are obtained. The measurements are obtained following transfer out of an etching system. If the yield is OK as determined at stage 610, then the system is set to run production at stage 612. If the yield is not ok, then the fractional dose mean is adjusted or a fractional dose distribution map is created in stage 614. After the adjusting and/or mapping, stage 604 is repeated. The "yield" is understood to be the middle thickness 140" or 706"

One embodiment of a stage 608 including an etching process and a photoresist removal process may form the substrate S shown in FIG. 7C. As shown, the photoresist layer 140 has been removed from the substrate S in the photoresist removal process. Also as shown, the second layer 706 has different thicknesses at the locations 714, 712, and 710. The locations 714, 712, and 710 correspond to locations that received a zero tone dose, a half tone dose, and a full tone dose, respectively. The different thicknesses of the second layer 706 are illustrated by representing the second layer 706 as comprising two components, a component 706' and a component 706". At the location 714, the photoresist layer 140 received a zero tone dose. Accordingly, prior to etching, the location 714 had a photoresist layer 140 having a component 140' and a component 140." The thicker remaining photoresist layer 140 resulted in a thicker second layer 706 after etching. The thicker second layer 706 is represented as having a component 706' and a component 706". As shown, the component 706' and the component 706" have approximately the same thickness.

At the location 712, the photoresist layer 140 received a half tone dose. Accordingly, prior to etching, the location 712 had a photoresist layer 140 having a component 140" but not a component 140'. Since the location 712 had a thinner remaining photoresist layer than the location 714, the remaining second layer 706 at the location 712 is thinner than the remaining second layer 706 at the location 714. Therefore, thickness 706" can be tuned by the fractional does delivered to the resist. The thickness 706" can be controlled by manufacturing yield with feedback control systems adjusting both the mean dose or by mapping a variable fractional dose across the substrate to correct for non-uniformities in processing steps such as the etching. The thickness of the second layer 706 at the location 712 relative to the thickness at the location 714 is represented by the location 712 having a component 706" but not a component 706'.

At the location 710, the photoresist layer 140 received a full tone dose. Accordingly, prior to etching the location 710 had neither a component 140' nor a component 140". Since the location 710 had a thinner remaining photoresist layer than the locations 712 and 714, the remaining second layer 706 at the location 710 is thinner than the remaining second layer 706 at the locations 712 and 714. As shown, the second layer 706 has been completely etched at the location 710, resulting in an exposed metal line 704. In a subsequent metallization step, the trench 720 and the 730 may be filled with a metal, forming a new metal line, and a contact between the metal line 704 and the new metal line.

The previously described embodiments have many advantages, including the following. For example, the methods disclosed herein allow for multiple tone exposure during photolithography without the use of expensive half tone masks. Additionally, the embodiments disclosed herein allow for readily and widely tuning the tone dose delivered to different locations on a photoresist layer. The tuneability of the embodiments disclosed herein allow for readily compensating for processing non-uniformities. With half tone masks, the tone dose is largely fixed when the mask is fabricated. The aforementioned advantages are illustrative and not limiting. It is not necessary for all embodiments to have all the advantages.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, the method comprising:
    positioning a substrate on a stage associated with a maskless direct writing pattern generator, wherein the substrate has an undeveloped, unexposed photoresist layer formed thereon, and wherein the photoresist layer has a plurality of writing pixel locations; and
    delivering first, second and third predetermined doses of electromagnetic energy from the pattern generator to each writing pixel location of the photoresist layer;
        wherein the first predetermined total dose is a full tone dose, and the first predetermined dose is delivered to a first set of writing pixel locations; and
        wherein the second predetermined total dose is a fractional tone dose, and the second predetermined dose is delivered to a second set of writing pixel locations; and
        wherein the third predetermined total dose is either a fractional tone dose or a zero tone dose, the third predetermined dose is delivered to a third set of writing pixel locations, and the third predetermined dose is different from the second predetermined dose.

2. The method of claim 1, wherein the pattern generator comprises a spatial light modulator (SLM) comprising individually actuateable mirrors, and wherein at least one of the first predetermined dose, the second predetermined dose and the third predetermined dose is controlled by actuating the mirrors.

3. The method of claim 1, wherein the predetermined doses are delivered over a dosing cycle that includes a plurality of exposures.

4. The method of claim 3, wherein an individual dose delivered during an exposure of the plurality of disclosures is identical for the total dose and the fractional dose.

5. The method of claim 4, wherein an individual dose is delivered during each exposure of the plurality of exposures for the full tone dose.

6. The method of claim 5, wherein an individual dose is delivered during less than all exposures of the plurality of exposures for the fractional tone dose.

7. The method of claim 6, wherein an individual tone dose not delivered during any exposures of the plurality of exposures for the zero tone dose.

8. The method of claim 7, further comprising delivering a fourth predetermined total dose, wherein the fourth predetermined total dose is either a zero tone dose or a fractional tone dose, the fourth predetermined dose is delivered to a fourth set of writing pixel locations; and the fourth predetermined dose is different from the second predetermined dose and the third predetermined dose.

9. The method of claim 1, wherein at least one of the second predetermined dose and the third predetermined dose is configured to correct a processing non-uniformity, wherein the processing non-uniformity is an experimentally determined downstream processing non-uniformity, and wherein the experimentally determined non-uniformity is an etching non-uniformity.

10. The method of claim 1, wherein the predetermined doses are configured to generate a three-dimensional pattern in the photoresist layer, wherein the substrate further comprises a first dielectric layer having a metal line formed therein, a second dielectric layer positioned on top of the first dielectric layer and the metal line, the second dielectric layer positioned below the photoresist layer, wherein the predetermined doses are configured to form a trench above and intersecting the metal line, and wherein the predetermined doses are configured to form a via above the metal line, and further comprising etching the substrate, removing the photoresist, and metalizing the trench and via to form a second metal line and a contact between the metal line and the second metal line.

11. A pattern generator, comprising:
a stage configured to support a substrate in a plurality of writing cycle zone locations during respective ones of a plurality of writing cycles;
a writing beam actuator configured to independently direct each of a plurality of writing beams to writing pixel locations disposed upon a photoresist of a substrate; and
a computer processor configured to adjust the delivered writing dose for the respective writing pixel locations according to tone dose data, wherein the tone dose data is configured to generate a three-dimensional pattern in a photoresist layer of a substrate.

12. The pattern generator of claim 11, wherein the tone dose data is configured to correct processing non-uniformities.

13. The pattern generator of claim 12, wherein the processing non-uniformities are downstream etching non-uniformities.

* * * * *